(12) United States Patent
Kumar

(10) Patent No.: US 7,498,819 B2
(45) Date of Patent: Mar. 3, 2009

(54) METHOD, APPARATUS AND COMPUTER-READABLE CODE FOR DETECTING AN INCIPIENT GROUND FAULT IN AN ELECTRICAL PROPULSION SYSTEM

(75) Inventor: Ajith Kuttannair Kumar, Erie, PA (US)

(73) Assignee: General Electric Company, Schenectady, NY (US)

( * ) Notice: Subject to any disclaimer, the term of this patent is extended or adjusted under 35 U.S.C. 154(b) by 85 days.

(21) Appl. No.: 11/762,216

(22) Filed: Jun. 13, 2007

(65) Prior Publication Data

US 2007/0229090 A1    Oct. 4, 2007

Related U.S. Application Data

(63) Continuation-in-part of application No. 11/385,309, filed on Mar. 21, 2006, now Pat. No. 7,248,057.

(51) Int. Cl.
*G01R 31/14*    (2006.01)
*G01R 31/08*    (2006.01)
*H02H 3/00*    (2006.01)

(52) U.S. Cl. .......................... 324/509; 324/512; 361/42

(58) Field of Classification Search ................. 324/509, 324/510, 512, 500, 522, 523; 361/42, 44, 361/45, 49, 67, 78, 87; 73/116; 702/132; 714/25

See application file for complete search history.

(56) References Cited

U.S. PATENT DOCUMENTS 3,757,169 A    9/1973    Beresnikow
3,894,272 A    7/1975    Bentley
4,541,031 A    9/1985    Ibbetson (Continued)

*Primary Examiner*—Diego Gutierrez
*Assistant Examiner*—Hoai-An D Nguyen
(74) *Attorney, Agent, or Firm*—John Kramer, Esq.; Enrique J. Mora, Esq.; Beusse Wolter Sanks Mora & Maire, P.A.

(57) ABSTRACT

Method, apparatus and computer-readable code are provided for detecting a location of an incipient ground fault in an electrical propulsion system. The apparatus may include a sensor configured to sense a respective ground leakage signal associated with a ground of the propulsion system. The apparatus may further include a second sensor configured to sense a voltage difference across a positive rail and a negative rail of the direct current bus. A correlator is coupled to the first sensor to receive the ground leakage signal, and further coupled to receive at least one signal indicative of a respective energization state of a respective electrical phase for each respective one of the plurality of electrical devices. The correlator is configured to individually correlate the ground leakage signal with each received phase energization state signal, and supply an individual correlation signal between the received ground leakage signal and each received phase energization state signal. A processor is coupled to the correlator for processing each of the individual correlation signals supplied by the correlator and extracting a correlation value from the supplied correlation signals. The correlation value, when outside a threshold range, is indicative of an incipient ground fault in a respective phase of one of the plurality of electrical devices. A module is provided for dynamically adjusting the threshold range for detecting an incipient ground fault. The adjusting may be based on a magnitude and/or a rate of change of the magnitude of the sensed voltage difference across the positive and negative rails of the direct current bus.

10 Claims, 4 Drawing Sheets

U.S. PATENT DOCUMENTS

| | | |
|---|---|---|
| 4,827,369 A | 5/1989 | Saletta et al. |
| 4,837,519 A | 6/1989 | Lopetrone et al. |
| 5,160,926 A | 11/1992 | Schweitzer, III |
| 5,282,212 A | 1/1994 | Shah |
| 5,309,109 A | 5/1994 | Miyazaki et al. |
| 5,481,194 A | 1/1996 | Schantz et al. |
| 5,561,380 A | 10/1996 | Sway-Tin et al. |
| 5,710,777 A | 1/1998 | Gawne |
| 5,768,079 A | 6/1998 | Buell |
| 5,872,457 A | 2/1999 | Williams |
| 5,877,926 A | 3/1999 | Moisin |
| 5,945,802 A | 8/1999 | Konrad et al. |
| 5,946,172 A | 8/1999 | Hansson et al. |
| 5,982,593 A | 11/1999 | Kimblin et al. |
| 5,990,686 A | 11/1999 | Vokey et al. |
| 6,002,563 A | 12/1999 | Esakoff et al. |
| 6,049,143 A | 4/2000 | Simpson et al. |
| 6,081,122 A | 6/2000 | McCary |
| 6,318,160 B1 | 11/2001 | Bessler |
| 6,347,025 B1 | 2/2002 | Ulrich et al. |
| 6,421,618 B1 | 7/2002 | Kliman et al. |
| 6,437,963 B1 * | 8/2002 | Hamilton et al. ............ 361/227 |
| 6,497,182 B2 | 12/2002 | Melpolder et al. |
| 6,735,496 B1 | 5/2004 | Roman |
| 6,829,556 B2 | 12/2004 | Kumar |
| 7,050,279 B2 * | 5/2006 | Nojima ........................ 361/42 |
| 7,102,355 B1 | 9/2006 | Kumar |
| 7,344,202 B2 * | 3/2008 | Linebach et al. ......... 303/113.2 |
| 2003/0184932 A1 | 10/2003 | McNally et al. |
| 2004/0162696 A1 | 8/2004 | Kumar |
| 2006/0255656 A1 | 11/2006 | Linebach et al. |

* cited by examiner

METHOD, APPARATUS AND COMPUTER-READABLE CODE FOR DETECTING AN INCIPIENT GROUND FAULT IN AN ELECTRICAL PROPULSION SYSTEM

This application is a Continuation-In-Part of U.S. application Ser. No. 11/385,309 filed Mar. 21, 2006 now U.S. Pat. No. 7,248,057. This application is further related to U.S. patent application Ser. Nos. 11/762,312 and 11/762,163, filed concurrently herewith. Each of the foregoing applications is incorporated by reference herein in their entirety.

FIELD OF THE INVENTION

The present invention is generally related to electrical propulsion systems, and more particularly, to a method, apparatus and computer-readable code for detecting an incipient ground fault that may occur in an electrical propulsion system of a traction vehicle.

BACKGROUND OF THE INVENTION

Locomotives and transit vehicles, as well as other large traction vehicles used for heavy haul applications (off-highway trucks), commonly use an electrical propulsion system that includes various high power electrical components, such as generators, rectifiers, converters, traction motors, dynamic braking grids, cooling blowers, and the like. These components may fail over time due to various reasons, one of them being electrical grounds that may be caused by insulation degradation. For example, locomotives may operate in environments subject to varying conditions, such as causative of freezing and thawing, which can degrade an electrical insulation exposed to such varying conditions by causing cracks.

The propulsion system of a locomotive has many insulated windings, and excessive leakage current could develop over time due to various factors, such as aging, moisture, abrasions, dirt built-up and the like. This is especially true for the traction motors since moisture often gets into these components because of their location and exposure to relatively harsh environmental conditions. Failures due to excessive electrical leakage currents in an electrical system of locomotives are a leading cause of system shutdowns and locomotive mission failures.

Leakage current detectors have been used on many kinds of electrical equipment to protect the equipment from damage that could arise in the presence of a large electrical current and/or to protect personnel from injury, and there may be substantial industrial background on leakage current monitoring by techniques used in electrical utility or industrial applications. Ground faults may occur as a result of a fault in any of a number of different system components. In the context of a locomotive, such components by way of example can include the propulsion drive system, batteries, and auxiliary equipment. Within the propulsion drive system, ground faults can occur in one or several components, which include generator, rectifier, cabling, traction motor, dynamic brake resistor, and blower motor.

A known difficulty in dealing with ground conditions in a locomotive is that many of such conditions may be transitory in nature. Often when a ground fault condition occurs, the affected portion of the electrical system is deactivated, and the locomotive is scheduled for repairs. However, once the locomotive is shopped for repairs, the system may no longer exhibit abnormal grounds and the maintenance personnel cannot identify the source of the fault. This is often because the excessive leakage current is caused by moisture in the electrical components. By the time the locomotive is shopped, the moisture has dried out, thus eliminating the high leakage currents. The amount of moisture that is able to penetrate the insulation system and result in high leakage currents often depends in part on the condition of the insulation system. A healthy system experiences relatively small change in leakage current as a result of changing moisture conditions, whereas a system with degraded insulation may experience large changes in leakage current that is moisture dependent.

In view of the foregoing considerations, it is desirable to have early warning of leakage current development, (i.e., an incipient ground fault) in the electrical propulsion of the locomotive so that action may be taken before there is a locomotive disabling failure. More particularly, it would be desirable that such an action enables continued operation of the locomotive propulsion system so that the locomotive can fulfill a mission and be able to return on its own power to a locomotive service shop for a thorough check and repair.

It would be further desirable to have the ability to determine in real time the specific equipment that causes the incipient ground fault, as that condition occurs, so that service personnel can retrieve at a later time that information and be able to focus on that specific equipment once the locomotive eventually arrives to the locomotive service shop, without trying to mimic the environmental conditions that may have contributed to the occurrence of the incipient ground fault or without having to spend valuable resources and time on troubleshooting fault-free equipment.

BRIEF DESCRIPTION OF THE INVENTION

The present invention in one aspect thereof provides apparatus for detecting an incipient ground fault that may occur in an electrical propulsion system of a traction vehicle. The electrical propulsion system includes a plurality of electrical devices, each individual electrical device being potentially subject to an incipient ground fault in at least one electrical phase thereof. The apparatus may include a sensor configured to sense a respective ground leakage signal associated with a ground of the propulsion system. The apparatus may further include a second sensor configured to sense a voltage difference across a positive rail and a negative rail of the direct current bus. A correlator is coupled to the first sensor to receive the ground leakage signal, and further coupled to receive at least one signal indicative of a respective energization state of a respective electrical phase for each respective one of the plurality of electrical devices. The correlator is configured to individually correlate the ground leakage signal with each received phase energization state signal, and supply an individual correlation signal between the received ground leakage signal and each received phase energization state signal. A processor is coupled to the correlator for processing each of the individual correlation signals supplied by the correlator and extracting a correlation value from the supplied correlation signals. The correlation value, when outside a threshold range, is indicative of an incipient ground fault in a respective phase of one of the plurality of electrical devices. A module is provided for dynamically adjusting the threshold range for detecting an incipient ground fault. The adjusting may be based on a magnitude and/or a rate of change of the magnitude of the sensed voltage difference across the positive and negative rails of the direct current bus.

The present invention in another aspect thereof provides a method for detecting an incipient ground fault that may occur in an electrical propulsion system of a traction vehicle. The electrical propulsion system includes a plurality of electrical devices and a direct current (dc) bus, each individual electrical device being potentially subject to an incipient ground fault in at least one electrical phase thereof. The method allows sensing a respective ground leakage signal associated with a ground of the propulsion system. The method further allows sensing a voltage difference across a positive rail and a negative rail of the direct current bus. At least one signal indicative of a respective energization state of a respective electrical phase is monitored for each respective one of the electrical devices. The ground leakage signal is individually correlated with each phase energization state signal. An individual correlation signal is generated between the ground leakage signal and each phase energization state signal. A correlation value is determined from the generated correlation signals. The correlation value, when outside a threshold range, is indicative of an incipient ground fault in a respective phase of one of the plurality of electrical devices. The threshold range is dynamically adjusted for detecting an incipient ground fault. The adjusting may be based on a magnitude and/or a rate of change of the magnitude of the sensed voltage difference across the positive and negative rails of the direct current bus.

The present invention in yet another aspect thereof provides an article of manufacture comprising a computer program product comprising a computer-usable medium having a computer-readable code therein for detecting an incipient ground fault that may occur in an electrical propulsion system of a traction vehicle. The electrical propulsion system includes a plurality of electrical devices and a direct current (dc) bus, each individual electrical device being potentially subject to an incipient ground fault in at least one electrical phase thereof. The computer-readable code includes:

computer-readable code responsive to a sensed ground leakage signal associated with a ground of the propulsion system; computer-readable code responsive to a sensed voltage difference across a positive rail and a negative rail of the direct current bus; computer-readable code for monitoring at least one signal indicative of a respective energization state of a respective electrical phase for each respective one of the electrical devices; computer-readable code for individually correlating the ground leakage signal with each phase energization state signal; computer-readable code for generating an individual correlation signal between the ground leakage signal and each phase energization state signal; and computer-readable code for determining a correlation value from the generated correlation signals, said correlation value, when outside a threshold range, being indicative of an incipient ground fault in a respective phase of one of the plurality of electrical devices; and computer-readable code for dynamically adjusting the threshold range for detecting an incipient ground fault, the adjusting based on a magnitude and/or a rate of change of the magnitude of the sensed voltage difference across the positive and negative rails of the direct current bus.

BRIEF DESCRIPTION OF THE DRAWINGS

These and other advantages of the invention will be more apparent from the following description in view of the drawings that show.

DETAILED DESCRIPTION OF THE INVENTION

Figure 1:
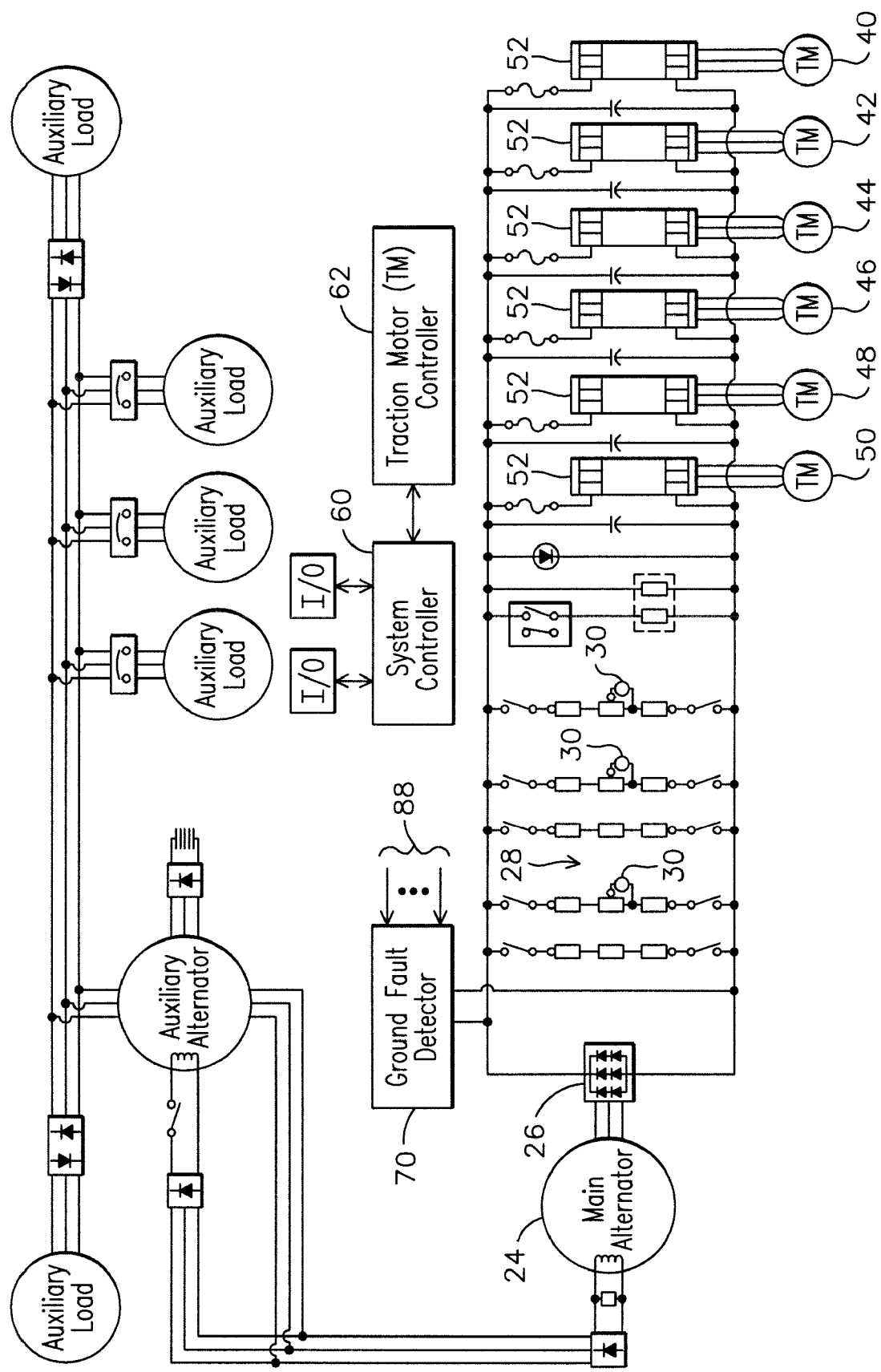
FIG. 1 is a schematic of one exemplary locomotive propulsion system that may benefit from aspects of the present invention.
Figure 2:
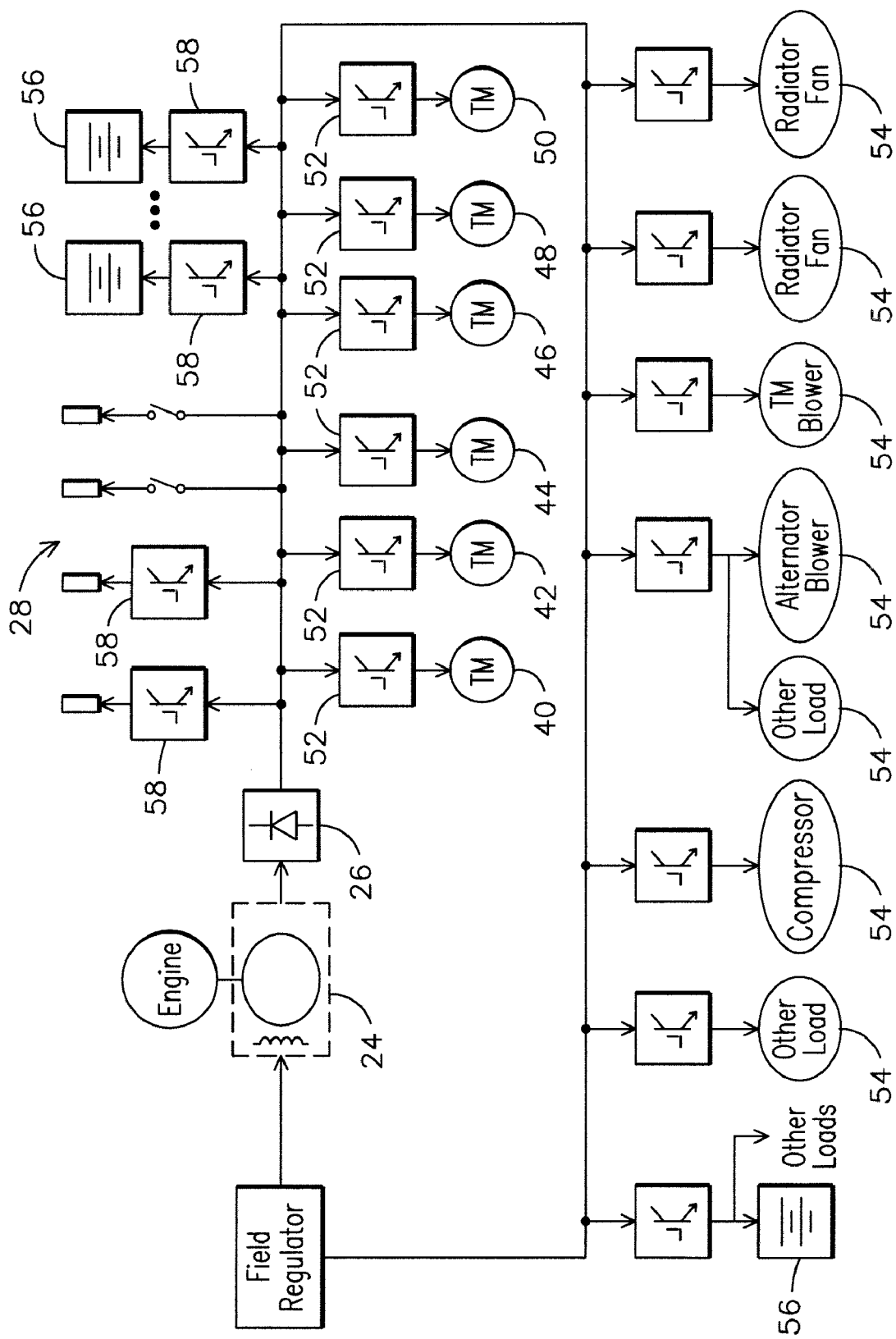
FIG. 2 is a schematic of another exemplary locomotive propulsion system that may also benefit from aspects of the present invention.

FIG. 1 is a simplified schematic of one exemplary propulsion system, such as may be used in a traction vehicle, such as a locomotive, a transit vehicle, or any other large traction vehicle as may be used for heavy haul applications (e.g., off-highway trucks). In one example embodiment, the propulsion system comprises a plurality of electrical devices that individually may be potentially subject to an incipient ground fault in at least one electrical phase thereof. Examples of such devices may be an alternator 24, a main rectifier 26, and a dynamic braking grid 28, which may include blowers 30. Further, illustrated in FIG. 1 are six traction motors 40, 42, 44, 46, 48, and 50, where each motor may be electrically connected to a respective inverter 52. As illustrated in FIG. 2 in connection with another example of a locomotive propulsion system 20, the electrical devices may further comprise various other electrical devices, such as various types of auxiliary electrical loads 54, energy storage devices 56 (e.g., batteries) as may be used in a hybrid vehicle, DC voltage step-up/step-down devices 58 (e.g., choppers), etc.

Returning to FIG. 1, the propulsion system may further include a propulsion system controller 60, a traction motor controller 62, and a ground fault detector 70 embodying aspects of the present invention. By way of example, a ground fault detector embodying aspects of the present invention will enable to detect essentially in real time (e.g., in the order of milliseconds) and with a single sensor the location of an incipient ground fault (i.e., a leakage current which if not quickly interrupted could result in a vehicle-disabling failure). The detection technique is performed without interrupting operation of the electrical devices that make up the propulsion system (e.g., performed "on the fly"), and consequently there is virtually no degradation in the operational performance of the propulsion system.

Figure 3:
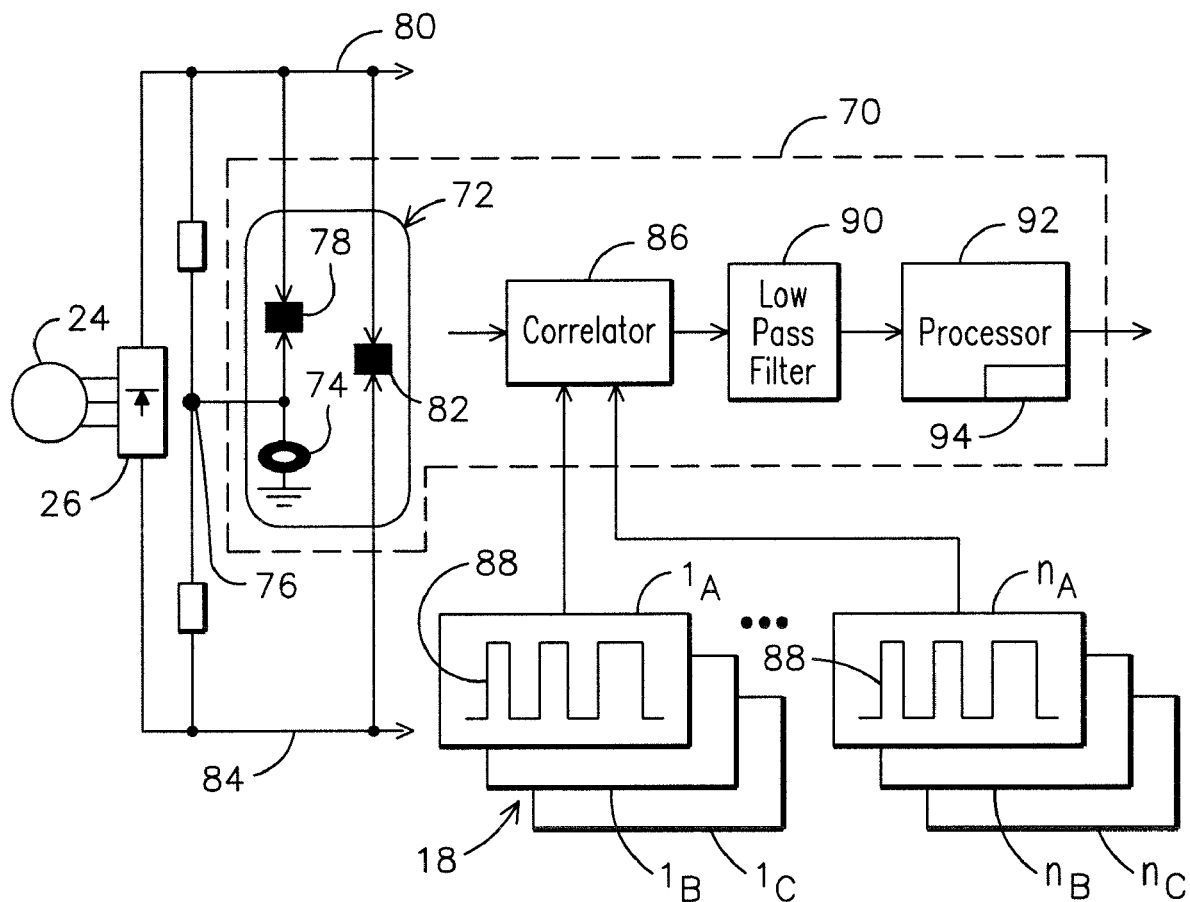
FIG. 3 illustrates circuit details regarding an exemplary ground fault detector embodying aspects of the present invention.

FIG. 3 illustrates details regarding an exemplary ground fault detector 70 that may include a sensor 72 configured to sense a respective ground leakage signal associated with a ground of the propulsion system. In one example, sensor 72 may comprise a current sensor 74 connected at an electrically neutral node 76, and may further comprise one or more voltmeters, such as a voltmeter 78 connected between a positive side 80 of a direct current (dc) bus and node 76, and/or a voltmeter 82 connected across the positive side 80 and a negative side 84 of the dc bus.

A correlator 86 is coupled to the sensor 72 to receive the ground leakage signal, and is further coupled to receive at least one signal 88 indicative of a respective energization state of a respective electrical phase for each respective one of the electrical devices. Each signal 88 provides an indication of whether the electrical phase of a respective one of the electrical devices is connected to a respective side of the dc bus. For example, block $1_A$ represents a signal indicative of the respective energization state of a first electrical phase (e.g., phase A) for a first one of the electrical devices. In this example, block $1_B$ represents a signal indicative of the respective energization state of a second electrical phase (e.g., phase B) for the first of the electrical devices and block $1_C$ represents a signal indicative of the respective energization state of a third electrical phase (e.g., phase C) for the first of the electrical devices. Similarly, block $n_A$ represents a signal indicative of the respective energization state of a first electrical phase (e.g., phase A) for an nth one of the electrical devices. In this example, block $n_B$ represents a signal indicative of the respective energization state of a second electrical phase (e.g., phase B) for the nth of the electrical devices and and block $n_C$ represents a signal indicative of the respective energization state of a third electrical phase (e.g., phase C) for the nth of the electrical devices. Examples of a signal 88 may be a phase firing signal such as the firing signal applied to a power switching device, such as an Insulated Gate Bipolar Transistor (IGBT) in a given inverter 52, or may be a voltage signal, such as the voltage that is developed across the phase of a given electrical device with respect to the positive (or the negative) side of the dc bus connected to the inverter, or may be a phase current signal, such as the current that flows through the phase of a given electrical device, or may be the current that flows through the switching device such as an IGBT, or may be a combination of the foregoing signals. For example in the case of a diode rectifier 26 connected between the alternator and the dc bus, the state of diode conduction (and hence whether the phase is connected to the positive or negative side of the dc bus) may be determined from the direction of current flowing in the phase. Similarly, when there is current flowing in the positive A phase diode, for example, then this indicates that phase A is connected to DC positive bus.

Correlator 86 is configured to individually correlate the received ground leakage signal with each received phase energization state signal 88, and supply an individual correlation (e.g., temporal interdependence) signal between the ground leakage signal and each received phase energization state signal. One example of correlator 86 is a multiplier device. That is, a device that multiplies the received ground leakage signal with each received phase energization state signal 88. In one example embodiment the multiplier value may be equal to unity, and may include a positive or a negative sign depending on the applicable energization state.

A filter 90, such as a low pass filter, may be coupled to the correlator 86 to provide a predefined filtering to the supplied correlation signals. This would enable to extract a dc (or low frequency) content from the correlation signal, such as may be present in an incipient dc fault ground. A processor 92 may be coupled to the filter 90 for processing each of the filtered correlation signals and extract a correlation value from the filtered correlation signals. The correlation value to be extracted may be determined based on a comparison of the respective values of the correlation signals with respect to a threshold range. For example, the extracted value may correspond to the correlation signal that exceeds the threshold value.

In one example embodiment, processor 92 may include a module 94 for dynamically adjusting the threshold range for detecting an incipient ground fault. The adjusting performed by module 94 may be based on a magnitude and/or a rate of change of the magnitude of a sensed voltage difference across the positive and negative rails of the direct current bus. For example, voltmeter 82 may be used for sensing the voltage difference across the positive and negative rails of the direct current bus.

This extracted correlation value, if any, is indicative of an incipient ground fault in a respective phase of one of the plurality of electrical devices. That is, this extracted value would indicate a strong temporal (time) interdependence or association between the ground leakage signal and the moment in time when a given electrical phase of a given electrical device is connected to the dc bus. It is noted that, as the correlation operation is performed, a temporarily shift in frequency or phase may be applied to the signals indicative of the respective energization state of the electrical phases of a given electrical device. This would allow locating ground faults that may occur in different phases of the same electrical device. Otherwise such multiple faults could be masked due to, for example, synchronicity between the phases of the firing signals.

It is noted that for the sake of simplicity of illustration FIG. 3 just shows one correlator and one low pass filter associated with a single signal 88. In the general case, assuming a number of m signals 88 (where m is a positive integer larger than one) one would employ a number of m correlators and m low pass filters, in lieu of the single correlator and filter shown in FIG. 3. For example, assuming six three-phase electrical devices, then m=6×3=18.

Figure 4:
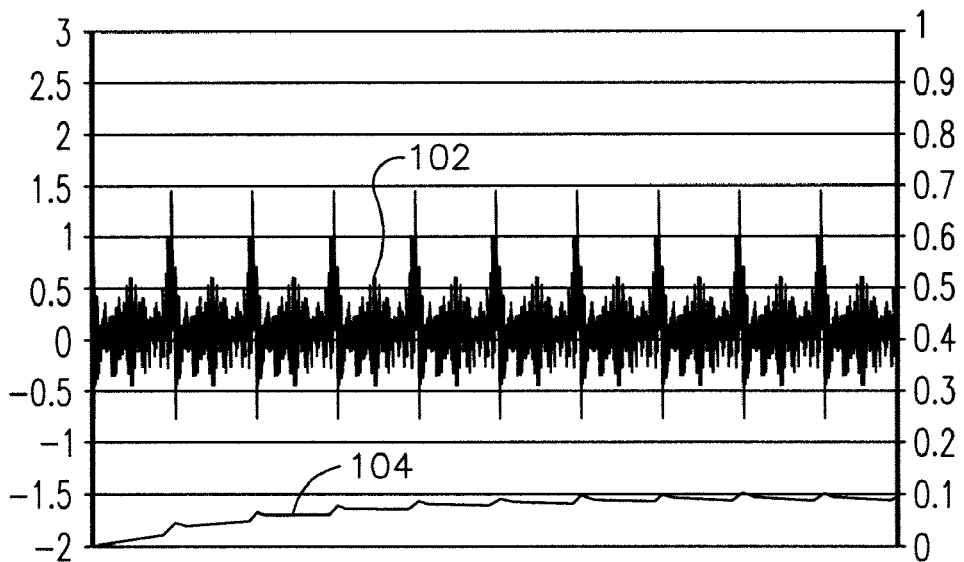
FIGS. 4-6 show graphical plots of exemplary test results of an apparatus for detecting an incipient ground fault in accordance with aspects of the present invention.
Figure 5:
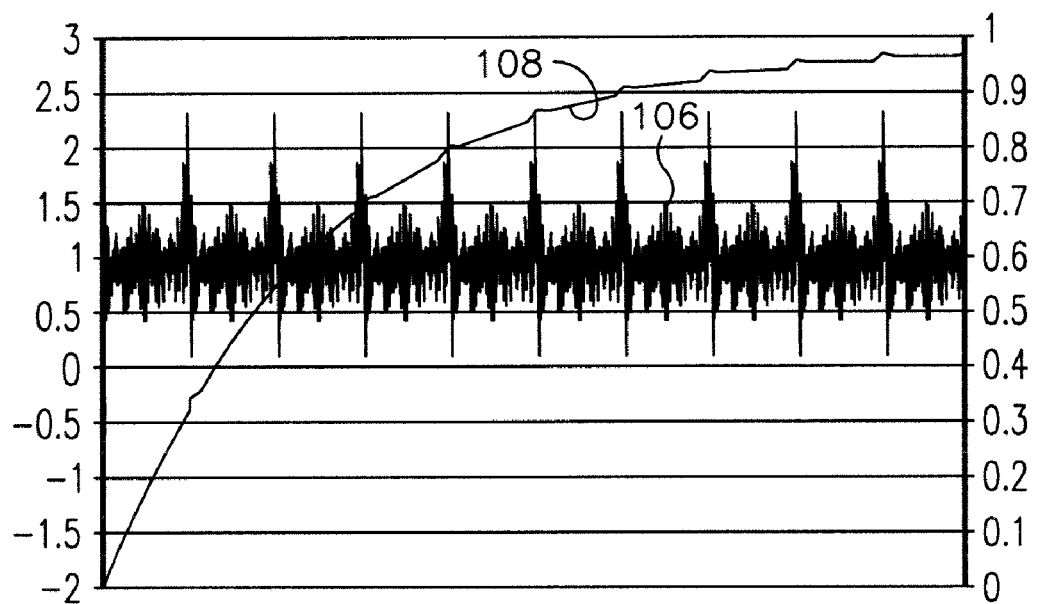
Figure 6:
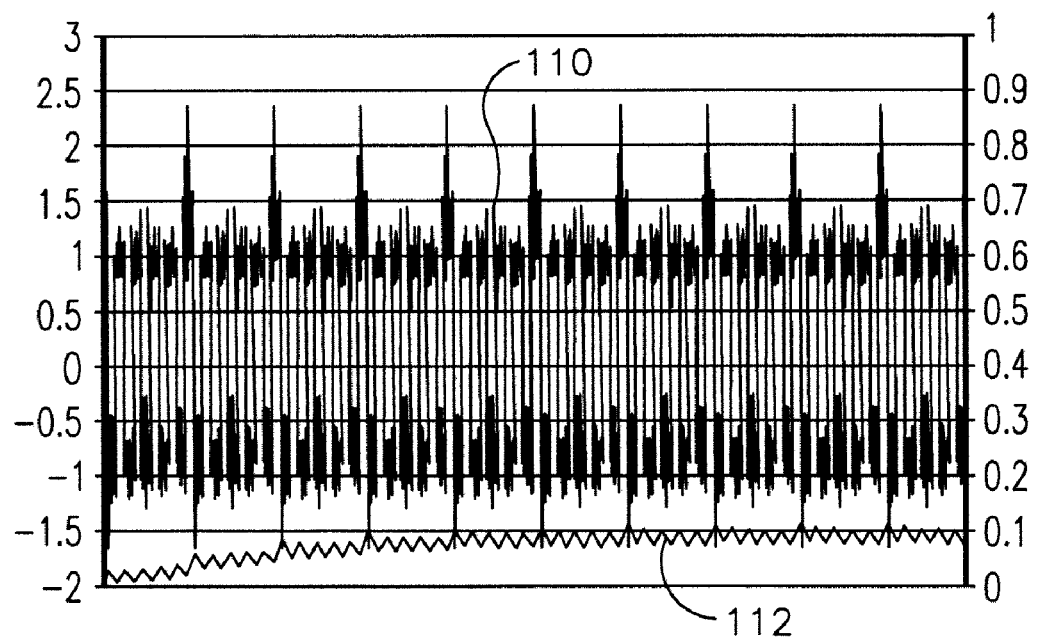

FIGS. 4-6 show graphical plots as a function of time of exemplary test results of an apparatus for detecting an incipient ground fault in accordance with aspects of the present invention. More particularly, FIG. 4 illustrates a non-fault ground condition in the propulsion system where, for example, a signal plot 102 (left vertical scale) corresponds to the ground leakage signal and a signal plot 104 (right vertical scale) corresponds to a correlated output signal.

By way of comparison, FIG. 5 illustrates an incipient ground fault being detected in a given electrical phase of a given electrical device. For example, the signal plot 106 (left vertical scale) illustrates a DC content in the ground leakage signal and a signal plot 108 (right vertical scale) illustrates a fast and measurable transient (in the order of a second or less, thereby demonstrating a desirable characteristic of a detector embodying aspects of the present invention) in the correlated output signal.

FIG. 6 illustrates exemplary signal plots in a given electrical device during the presence of an incipient ground fault in the electrical phase of another electrical device. A signal plot 110 (left vertical scale) illustrates a ground leakage signal similar to the one shown in FIG. 4 during a no ground fault condition. Similarly, a signal plot 112 (right vertical scale) for the correlated output signal of the electrical device without the incipient ground fault shows no evidence of a fault condition, thereby demonstrating that an apparatus for detecting an incipient ground fault in accordance with aspects of the present invention is substantially impervious to cross-coupling effects due to ground fault conditions present in other electrical devices while monitoring a given electrical device.

Aspects of the present invention can be embodied in the form of computer-implemented processes and apparatus for practicing those processes. The present invention can also be embodied in the form of computer program code including computer-readable instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. When implemented on a computer, the computer program code segments configure the computer to create specific logic circuits or processing modules.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

The invention claimed is:

1. Apparatus for detecting an incipient ground fault that may occur in an electrical propulsion system of a traction vehicle, said electrical propulsion system comprising a plurality of electrical devices and a direct current (dc) bus, each individual electrical device being potentially subject to an incipient ground fault in at least one electrical phase thereof, said apparatus comprising:
   a first sensor configured to sense a ground leakage signal associated with a ground of the propulsion system;
   a second sensor configured to sense a voltage difference across a positive rail and a negative rail of the direct current bus;
   a correlator coupled to the first sensor to receive the ground leakage signal, and further coupled to receive at least one signal indicative of a respective energization state of a respective electrical phase for each respective one of the plurality of electrical devices, said correlator configured to individually correlate the ground leakage signal with each received phase energization state signal, and supply an individual correlation signal between the ground leakage signal and each received phase energization state signal;
   a processor coupled to the correlator for processing each of the individual correlation signals supplied by the correlator and extract a correlation value from the supplied correlation signals, said correlation value, when outside a threshold range, being indicative of an incipient ground fault in a respective phase of one of the plurality of electrical devices; and
   a module for dynamically adjusting the threshold range for detecting an incipient ground fault, the adjusting based on a magnitude and/or a rate of change of the magnitude of the sensed voltage difference across the positive and negative rails of the direct current bus.

2. The apparatus of claim 1 wherein the signal indicative of the respective energization state of the electrical phase of a respective electrical device is selected from the group consisting of a phase firing signal, a voltage signal with respect to a direct current (dc) bus, a phase current signal, a current that flows through a power switching device connected to the dc bus, and a combination of the foregoing signals.

3. The apparatus of claim 1 further comprising a low pass filter connected to the correlator and configured to provide a predefined filtering to the supplied correlation signals.

4. The apparatus of claim 1 wherein the sensor configured to sense the respective ground leakage signal is selected from the group consisting of a current sensor, and at least one or more voltage sensors.

5. The apparatus of claim 1 wherein the traction vehicle is selected from the group consisting of a locomotive, a transit vehicle, and an off-highway vehicle.

6. The apparatus of claim 1 wherein the correlator comprises a multiplier.

7. The apparatus of claim 1 wherein said correlator comprises a plurality of m correlators, each of said m correlators being individually connected to receive one signal indicative of a respective energization state of a respective electrical phase of one of the plurality of electrical devices, wherein m is a positive integer corresponding to the number of electrical devices times the number of electrical phases per device.

8. The apparatus of claim 3 wherein said correlator comprises a plurality of m correlators, each of said m correlators being individually connected to receive one signal indicative of a respective energization state of a respective electrical phase of one of the plurality of electrical devices, wherein m is a positive integer corresponding to the number of electrical devices times the number of electrical phases per device, and further wherein said low pass filter comprises a plurality of m low pass filters, each one of said m filters being individually connected to one of said m correlators to provide a predefined filtering to one supplied correlation signal.

9. A method for detecting an incipient ground fault that may occur in an electrical propulsion system of a traction vehicle, said electrical propulsion system comprising a plurality of electrical devices and a direct current (dc) bus, each individual electrical device being potentially subject to an incipient ground fault in at least one electrical phase thereof, said method comprising:
   sensing a ground leakage signal associated with a ground of the propulsion system;
   sensing a voltage difference across a positive rail and a negative rail of the direct current bus;
   monitoring at least one signal indicative of a respective energization state of a respective electrical phase for each respective one of the electrical devices;
   individually correlating the ground leakage signal with each phase energization state signal;
   generating an individual correlation signal between the ground leakage signal and each phase energization state signal;
   determining a correlation value from the generated correlation signals, said correlation value, when outside a threshold range, being indicative of an incipient ground fault in a respective phase of one of the plurality of electrical devices; and
   dynamically adjusting the threshold range for detecting an incipient ground fault, the adjusting based on a magnitude and/or a rate of change of the magnitude of the sensed voltage difference across the positive and negative rails of the direct current bus.

10. An article of manufacture comprising a computer program product comprising a computer-usable medium having a computer-readable code therein for detecting an incipient ground fault that may occur in an electrical propulsion system of a traction vehicle, said electrical propulsion system comprising a plurality of electrical devices and a direct current (dc) bus, each individual electrical device being potentially subject to an incipient ground fault in at least one electrical phase thereof, said computer-readable code comprising:
   computer-readable code responsive to a sensed ground leakage signal associated with a ground of the propulsion system;
   computer-readable code responsive to a sensed voltage difference across a positive rail and a negative rail of the direct current bus;
   computer-readable code for monitoring at least one signal indicative of a respective energization state of a respective electrical phase for each respective one of the electrical devices;
   computer-readable code for individually correlating the ground leakage signal with each phase energization state signal;
   computer-readable code for generating an individual correlation signal between the ground leakage signal and each phase energization state signal;
   computer-readable code for determining a correlation value from the generated correlation signals, said correlation value, when outside a threshold range, being indicative of an incipient ground fault in a respective phase of one of the plurality of electrical devices; and
   computer-readable code for dynamically adjusting the threshold range for detecting an incipient ground fault, the adjusting based on a magnitude and/or a rate of change of the magnitude of the sensed voltage difference across the positive and negative rails of the direct current bus.

* * * * *